US008883549B2

(12) United States Patent
Chin

(10) Patent No.: US 8,883,549 B2
(45) Date of Patent: Nov. 11, 2014

(54) P-DOPING OF CDTE POLYCRYSTALLINE THIN FILM BASED ON CD VACANCY THEORY

(75) Inventor: Ken K. Chin, Pine Brook, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 252 days.

(21) Appl. No.: 13/164,836

(22) Filed: Jun. 21, 2011

(65) Prior Publication Data
US 2012/0042950 A1 Feb. 23, 2012

Related U.S. Application Data

(60) Provisional application No. 61/357,058, filed on Jun. 21, 2010.

(51) Int. Cl.
| | |
|---|---|
| *H01L 31/18* | (2006.01) |
| *H01L 31/0296* | (2006.01) |
| *H01L 31/073* | (2012.01) |

(52) U.S. Cl.
CPC ............ *H01L 31/073* (2013.01); *Y02E 10/543* (2013.01); *H01L 31/02963* (2013.01); *H01L 31/1828* (2013.01)
USPC ................ 438/95; 438/86; 136/260; 136/264

(58) Field of Classification Search
CPC ..................... H01L 31/1828; H01L 31/02963; H01L 31/1832; H01L 31/186
USPC .......................... 438/84, 95, 97; 136/260, 264
See application file for complete search history.

(56) References Cited

U.S. PATENT DOCUMENTS

| | | | |
|---|---|---|---|
| 5,501,744 | A | 3/1996 | Albright et al. |
| 5,804,463 | A | 9/1998 | Tregilgas et al. |
| 6,169,246 | B1 | 1/2001 | Wu et al. |
| 6,251,701 | B1 | 6/2001 | McCandless |
| 2005/0224111 | A1 | 10/2005 | Cunningham et al. |
| 2008/0251119 | A1 | 10/2008 | Forehand |

OTHER PUBLICATIONS

Chin, p-Doping Limit and Donor Compensation in CdTe Polycrystalline Thin Film Solar Cells, Sol. Energy Mater. Sci. Cells, May 31, 2001, Retrieved from the internet: URL: http://physics.njit.edu/research/apollo/docs/2010/100531_Cu_Doping_Limit.pdf, entire document.

PCT International Search Report and Written Opinion dated Oct. 11, 2011.

Wei, S. et al., Chemical Trends of Defect Formation and Doping Limit in II-VI Semiconductors: The Case of CdTe, Phys. Rev. B, 66, 15521, 2002.

Wu, X., High Efficiency Polycrystalline Thin-Film Solar Cells, Solar Energy, 77, 803-814, 2004.

(Continued)

*Primary Examiner* — Earl Taylor
(74) *Attorney, Agent, or Firm* — McCarter & English, LLP

(57) ABSTRACT

Exemplary embodiments of the present disclosure are directed to improve p-type doping (p-doping) of cadmium telluride (CdTe) for CdTe-based solar cells, such as cadmium Sulfide (Cds)/CdTe solar cells. Embodiments can achieve improved p-doping of CdTe by creating a high density of cadmium (Cd) vacancies ($V_{Cd}$) and subsequently substituting a high density of substitutional defects and/or defect complexes for the Cd vacancies that were created. Formation of a high density of substitutional defects and defect complexes as a p-dopant can improve light-to-electricity conversion efficiency, doping levels or hole concentrations, junction band bending, and/or ohmic contact associated with p-type CdTe (p-CdTe) based solar cells.

15 Claims, 3 Drawing Sheets

(56) References Cited

OTHER PUBLICATIONS

Macdonald, D. et al., Recombination activity of interstitial iron and other transition metal point defects in p- and n- type crystalline silicon, Appy. Phys. Lett., 85, No. 18, 2004.

Seymour, F., Studies of Electronic States Controlling the Performance of CdTe Solar Cells, Ph.D. (Materials Science) Thesis, Colorado School of Mines, p. 35, 2005.

King, R.R. et al., 40% efficient metamorphic GaInP/GaInAs/Ge multijunction solar cells, Applied Physics Lettters 90, 183516-1 to 183516-3, 2007.

Repins, I. et al., 19.9%-efficient ZnO/CdS/CuInGaSe$_2$ Solar Cell with 81.2% Fill Factor, Prof. Photovolt: Res. Appl. 2008; 16:235-239.

Attygalle, M. et al., A Dissertation entitled: Theoretical modeling of polycrystalline thin-film photovoltaics, pp. 1-151, The University of Toledo, May 2008.

Gessert, T.A. et al., Effects of CU Diffusion from ZnTe/Cu/Ti Contacts on Carrier Lifetime of CdS/CdTe Thin Film Solar Cells, presented at the 33$^{rd}$ IEEE Photovoltaic Specialists Conference, San Diego, California, 2008, pp. 1-8.

Gessert, T.A. et al., Dependence of Carrier Lifetime on Copper-contacting Temperature and ZnTe:Cu Thickness in CdS/CdTe Thin Film Solar Cells, Thin Solid Films, 517, 2370-2373, 2009.

P-DOPING OF CDTE POLYCRYSTALLINE THIN FILM BASED ON CD VACANCY THEORY

CROSS REFERENCE TO RELATED APPLICATIONS

This application claims priority to U.S. Provisional Application No. 61/357,058 filed on Jun. 21, 2010, which is incorporated by reference herein in its entirety.

FIELD OF TECHNOLOGY

Exemplary embodiments are directed to p-type doping of a polycrystalline thin film photovoltaic material for solar cells, and particularly to p-type doping of cadmium telluride (CdTe) thin film for CdTe based solar cells.

BACKGROUND

Cadmium telluride (CdTe) based solar cells have emerged in recent years as commercially successful second generation thin film photovoltaic (PV) products. Despite intensive research, however, the ratio of lab demonstrated light-to-electricity conversion efficiency has been low. For example, while CdTe based solar cells can have a theoretical conversion efficiency limit of about 29%, a conversion efficiency of only about 16.5% has been achieved in practice. Despite having a theoretical conversion efficiency limit that is higher than some other thin film technologies, the CdTe based solar cells tend to trail these thin film technologies in realized conversion efficiency. For example, cadmium indium gallium selenide (CIGS) based solar cells have a lower theoretical conversion efficiency limit of only about 26%, but a higher realized conversion efficiency of about 19.9%.

One of the reasons for this conversion efficiency discrepancy may be a low doping level or hole concentration of p-type CdTe (p-CdTe). It is often desired to have a p-type doping (p-doping) level on the order of about $10^{16}$ to $10^{17}$ cm$^{-3}$. However, the p-doping level of CdTe is typically on the order of about $10^{14}$ cm$^{-3}$. As a result, CdTe based solar cells typically experience lower junction band bending and difficulty with ohmic contact, both of which can contribute to a lower open circuit voltage ($V_{OC}$), and therefore, a lower conversion efficiency.

The doping level of a semiconductor device can be dependent, at least in part, on the activation energy of the dopant and/or the localized impurity/defect mid-bandgap (midgap) electronic states (hereinafter "impurity/defect states") of the doped semiconductor device. There are several approaches to classifying the impurity/defect states including dopant/deep level classification, shallow/non-shallow dopant classification, single-level/multi-level state classification, and states of single or multiple atomic configuration classification. These classification schemes can provide some insight regarding which impurity/defect states may be responsible for p-doping of CdTe polycrystalline thin film in a CdS/CdTe junction solar cell. By way of background, each of these classification schemes are described below.

Dopant and Deep Level Classification

Using the dopant and deep level classification scheme, localized states in the bandgap of a semiconductor are usually classified as either dopants or deep levels based on a proximity of their ionization energy levels to the band edge. The dopant dopes the semiconductor, determining its type (n or p), Fermi level, and majority carrier density. The deep levels may compensate the doping level of the dopants, but are mostly treated as Shockley-Read-Hall (SRH) generation-recombination centers, with negative impact on the performance of most devices, including solar cells.

The localized states can be defined as dopants if the ionization or activation energy levels associated with the localized states are less than 0.05 eV from the band edge, and as deep levels if greater than 0.05 eV. Such a classification and description of the localized states in a semiconductor is generally appropriate for most widely used semiconductor materials, such as Si and GaAs, which are usually intentionally doped with a single dominant dopant state of shallow energy level and inadvertently incorporate undesired deep levels with concentration typically at least one order lower than that of the dopant. For n-type and p-type doping under the dopant and deep level classification scheme, the electron density n and the hole density p can be expressed as follows:

$$\begin{cases} \text{For } n\text{-type} & n \approx N_D^+ \approx N_D \quad \text{or} \quad n \approx N_D - N_A \quad \text{with acceptor compensation} \\ \text{For } p\text{-type} & p \approx N_A^- \approx N_A \quad \text{or} \quad p \approx N_A - N_D \quad \text{with donor compensation} \end{cases} \quad (1)$$

where $N_D$, $N_D^+$, $N_A$, and $N_A^-$ are the concentrations or densities of donors, ionized donors, acceptors, and ionized acceptors, respectively.

Such a classification of states is not appropriate for CdTe. According to this classification, p-CdTe polycrystalline thin film would not likely have dopants, because no acceptor levels typically can be found in CdTe thin film with activation so close to the valence band edge.

Shallow Dopants and Non-Shallow Dopant Classification

Classification of impurity/defect states as either dopants or deep levels based on equation (1) may not be appropriate for wide bandgap materials, including CdTe, which may lack fully ionized shallow dopants. The shallow/non-shallow classification scheme addresses this by classifying impurity/defect states based on a probability of ionization. Following the laws of thermodynamics, the probabilities of ionization of a donor state and of an acceptor state are referred to the Fermi level $E_F$. In this regard, the concentration of ionized donors $N_D^+$ and the concentration of ionized acceptors $N_A^-$ can be expressed mathematically as follows:

$$\begin{cases} N_D^+ = N_D \dfrac{1}{1 + g_D \exp\left(\dfrac{E_F - E_D}{kT}\right)} \\ N_A^- = N_A \dfrac{1}{1 + g_A \exp\left(\dfrac{E_A - E_F}{kT}\right)} \end{cases} \quad (2)$$

where $g_D$ and $g_A$ are the degeneracy of the donor and acceptor states, respectively, $E_A$ is the acceptor activation energy, $E_D$ is the donor activation energy, $E_F$ is the Fermi energy or level, k is the Boltzmann constant, T is absolute temperature in Kelvin, and the product of the Boltzmann constant k and the absolute temperature T is 0.0259 electron Volts (kT=0.0259 eV). The degeneracy of the donor states is 2 ($g_{D=2}$) due to spin degeneracy, and the degeneracy of the acceptor states $g_A$ depends on the material. For tetrahedral cubic semiconductors, such as Si, GaAs, and CdTe, the degeneracy of acceptor states is 4 ($g_A$=4). In addition to the contribution of spin degeneracy on the degeneracy of the acceptor states $g_A$, the acceptor states also have the heavy hole and light hole degeneracy. $E'_D$ and $E'_A$ can be substituted for $E_D$ and $E_A$, respectively, in equation (2), where $E'_D$ and $E'_A$ can be represented mathematically as follows:

$$\begin{cases} E'_D = E_D - kT \ln g_D \\ E'_A = E_A + kT \ln g_A \end{cases} \quad (3)$$

By substituting $E'_D$ and $E'_A$ for $E_D$ and $E_A$, respectively, in equation (2), the concentration of ionized donors and ionized acceptors can be simplified as follows:

$$\begin{cases} N_D^+ = N_D \dfrac{1}{1 + \exp\left(\dfrac{E_F - E'_D}{kT}\right)} \\ N_A^- = N_A \dfrac{1}{1 + \exp\left(\dfrac{E'_A - E_F}{kT}\right)} \end{cases} \quad (4)$$

Using the above, impurity/defects states can be classified as shallow or non-shallow as follows:

$$\begin{cases} \text{Donor} \begin{cases} \text{Shallow} & E'_D - E_F > 3kT & > 95\% \text{ ionized} \\ \text{Non-shallow} & E_F - E'_D > 3kT & < 5\% \text{ ionized} \end{cases} \\ \text{Acceptor} \begin{cases} \text{Shallow} & E_F - E'_A > 3kT & > 95\% \text{ ionized} \\ \text{Non-shallow} & E'_A - E_F > 3kT & < 5\% \text{ ionized} \end{cases} \end{cases} \quad (5)$$

As shown in FIG. 1, the activation energy of the donor state D is closer to a band edge (e.g., $E_v$ and $E_c$) than that of the acceptor state A. Yet the acceptor state is fully ionized with $p=N_A$, and the donor state is only partially ionized with $n \ll N_D$.

Single-Level and Multi-Level State Classification

The single or multi-level state classification scheme proposes using "transition energy level" instead of "state" to describe the transition between two charge states of a localized impurity/defect. For example, an acceptor state is an impurity/defect with a transition from empty or neutral to occupied or negatively charged with an electron, which can be represented graphically as (o/−). A double acceptor is an impurity/defect with two possible transitions: from neutral to negative (o/−) and from negative to twice as negative (−/2−). Therefore, a localized impurity/defect may have a single transition level or multiple transition levels. The local charge neutrality (LCN) condition of a semiconductor with only single-level states can be expressed mathematically as follows:

$$N_V \exp\left(\dfrac{E_V - E_F}{kT}\right) + \sum_i N_{D_i} \dfrac{1}{1 + \exp\left(\dfrac{E_F - E'_{D_i}}{kT}\right)} = \\ N_C \exp\left(\dfrac{E_F - E_C}{kT}\right) + \sum_j N_{A_j} \dfrac{1}{1 + \exp\left(\dfrac{E'_{A_j} - E_F}{kT}\right)} \quad (6)$$

where $E_V$ is the valence band maximum (VBM), $E_C$ is the conduction band minimum (CBM), $N_V$ is the effective hole density in the valence band, and $N_C$ is the effective electron density in the conduction band. From equation (6), it is possible to solve the Fermi level, and with it the majority carrier density, using a numerical or graphical method.

FIGS. 2A-C show the activation energy of multi-level states. For example, referring to FIG. 2A, the double acceptor cadmium (Cd) vacancy in CdTe has a first activation energy 200 of 0.14 eV and a second activation energy 210 of 0.40 eV.

A generalized formulation of LCN equation of a semiconductor with single and double donors as well as single and double acceptors can be expressed mathematically as follows (for simplicity, the divalent amorphetic defect states are not included):

$$N_V \exp\left(\dfrac{E_V - E_F}{kT}\right) + \sum_i N_{D_i} \dfrac{1}{1 + \dfrac{g_{D_i}^{(0)}}{g_{D_i}^{(+)}} \exp\left(\dfrac{E_F - E_{D_i}}{kT}\right)} + \sum_l N_{DD_l} \quad (7)$$

$$\dfrac{\dfrac{g_{DD_l}^{(+)}}{g_{DD_l}^{(2+)}} \exp\left(\dfrac{E_F - E_{DD_l}^{(2+/+)}}{kT}\right) + 2}{1 + \dfrac{g_{DD_l}^{(+)}}{g_{DD_l}^{(2+)}} \exp\left(\dfrac{E_F - E_{DD_l}^{(2+/+)}}{kT}\right) + \dfrac{g_{DD_l}^{(0)}}{g_{DD_l}^{(2+)}} \exp\left[\dfrac{2(E_F - E_{DD_l}^{(2+/0)})}{kT}\right]} =$$

$$N_C \exp\left(\dfrac{E_F - E_C}{kT}\right) + \sum_j N_{A_j} \dfrac{1}{1 + \dfrac{g_{A_j}^{(0)}}{g_{A_j}^{(-)}} \exp\left(\dfrac{E_{A_j} - E_F}{kT}\right)} + \sum_m N_{AA_m}$$

$$\dfrac{\dfrac{g_{AA_m}^{(-)}}{g_{AA_m}^{(2-)}} \exp\left(\dfrac{E_{AA_m}^{(-/2-)} - E_F}{kT}\right) + 2}{1 + \dfrac{g_{AA_m}^{(-)}}{g_{AA_m}^{(2-)}} \exp\left(\dfrac{E_{AA_m}^{(-/2-)} - E_F}{kT}\right) + \dfrac{g_{AA_m}^{(0)}}{g_{AA_m}^{(2-)}} \exp\left[\dfrac{2(E_{AA_m}^{(0/2-)} - E_F)}{kT}\right]}$$

where subscript DD implies double donor, and implies AA double acceptors.

Single Atomic Configuration and Multiple Atomic Configuration Classification

Divalent states, such as Cd vacancies ($V_{Cd}$) in CdTe, have multiple transition energy levels, but a single atomic configuration with the same energy of formation. Another category of multi-level states is the multiple transition energy levels, which are due to multiple atomic configurations. For example, an impurity may have atomic configuration a with transition energy level $E_a$, and atomic configuration b with transition energy level $E_b$. The ratio of occupation of the impurity in configuration a and b is determined by Boltzmann distribution as follows:

$$\dfrac{N_a}{N_b} = \exp\left(-\dfrac{\Delta H_a}{\Delta H_b}\right) \quad (8)$$

where $\Delta H_a$ and $\Delta H_b$ are the energies of formation of the configuration a and b, respectively.

Note that the transition from a to b, or vice versa, may incur an energy barrier to overcome, and the ratio of $N_a$ vs. $N_b$ may be in a metastable state, different from eq. (8). The impurity with configuration a and configuration b can be treated as two independent states, not related to each other. The uncertainty of $N_a/N_b$ may impose severe challenges to the processing, stability, reliability, and proper operation of a device made of a semiconductor material with such multi-configurational impurity/defect states. An elevated temperature may trigger the change from one configuration to the other: from a shallow donor state to a deep level trap, from a donor state to an acceptor state, etc. An important example of multi configuration defect is copper (Cu) in CdTe. Cu can substitute Cd to form an acceptor $Cu_{Cd}$, and Cu can also be an interstitial donor $Cu_i$.

To summarize, polycrystalline thin film CdTe is a non traditional semiconductor material with multiple, non-shallow, multi-level, multi-configuration, and self compensating localized defect states.

Double Acceptor Cd Vacancy in Polycrystalline CdTe Thin Film

Solar cells made of single crystalline semiconductor material usually have higher optic-electrical conversion efficiency than those made of polycrystalline thin film material. For example, single crystalline Si solar cell performs better than polycrystalline Si solar cell, which, in turn, has a higher conversion efficiency than amorphous Si thin film solar cell. CdS/CdTe solar cells are an exception. A great amount of R&D work has been done, with little or no success, in the effort of fabricating a single crystalline CdTe photovoltaic device, using such expensive facilities as MBE (molecular beam epitaxy) and MOCVD (metal organic chemical vapor deposition). A solar cell made of single crystalline CdTe performs far worse than its counterpart made of polycrystalline (PV) thin film. This experimental fact implies that the Cd vacancies incorporated more in CdTe thin film than in single crystal CdTe may play a critically important role in CdTe PV technology.

As shown in FIG. 3, a thorough search and first principle calculation reveals that potentially there are only three groups of p-dopants for CdTe: (a) the V-column element substitute of Te, a single acceptor, such as $P_{Cd}$, $As_{Cd}$, and $Sb_{Cd}$; (b) the Cd vacancy ($V_{Cd}$); a double acceptor; and (c) a noble metal substitute of Cd, a single acceptor, such as a copper (Cu) substitute of cadmium (Cd) ($Cu_{Cd}$) and a silver (Ag) substitute of cadmium (Cd) ($Ag_{Cd}$). The first group of acceptors cannot be formed in polycrystalline thin film CdTe, which has a high density of Cd vacancies. The energy of formation of the V-column impurity atom substitute of Cd by falling into the Cd vacancy is much favorable than that of V-column impurity atom to replace the Te in the crystal structure.

The double acceptor $V_{Cd}$, which represents a second potential p-dopant for CdTe, naturally exists in low cost CdTe polycrystalline thin film, especially on the grain boundaries. The first ionization energy level of $V_{Cd}$ is 0.13 eV (calculated) or 0.15 eV (experimental), which make the Cd vacancy a viable p-dopant. However, its second ionization energy level (0.21 eV calculated, and 0.6-0.9 eV experimental) makes $V_{Cd}$ a Shockley-Read-Hall (SRH) recombination center, which leads to dark current in PV diodes. Therefore, $V_{Cd}$ is not an ideal p-dopant for CdTe.

The third group of potential p-dopant CdTe is a noble metal substitute of Cd, especially $Cu_{Cd}$. CdTe thin film typically uses low cost 5N tellurium, which, either as a byproduct of copper refinery or a raw material from independent tellurium mine, may have up to $2\times10^{-6}$ (2 ppm) Cu impurity content. In addition, as part of the back contact material, Cu diffuses into the CdTe thin film. $Cu_{Cd}$ is a single level acceptor with calculated ionization or activation energy of 0.22 eV, and experimental value of 0.15 eV (by photoluminescence), 0.3~0.4 eV (rendered by Hall effect measurement), or 0.35 eV (by using deep level transient spectroscopy or DLTS). Although not ideally shallow, as a p-dopant the single level acceptor $Cu_{Cd}$ will not introduce the same amount of SRH recombination centers as the double acceptor $V_{Cd}$ does.

SUMMARY

In one aspect, a method of doping a polycrystalline thin film photovoltaic material for a solar cell is disclosed. The method includes introducing a reactive oxidizer to the polycrystalline thin film photovoltaic material during thin film growth to create vacancies in the polycrystalline thin film photovoltaic material and exposing the polycrystalline thin film photovoltaic material to a vacancy substitution agent after thin film growth to defect complexes for the vacancies in the polycrystalline thin film photovoltaic material. The vacancy substituting agent is a chemical compound including an element present in the polycrystalline thin film photovoltaic material and a halogen. The present disclosure also provides for a substitutional defect, such as a noble metal, to be substituted for the vacancies In another aspect, a method of doping a cadmium telluride (CdTe) thin film for a cadmium Sulfide/cadmium telluride (CdS/CdTe) solar cell is disclosed. The method includes introducing the CdTe thin film to a reactive oxidizer during growth of the CdTe thin film to create cadmium vacancies in the CdTe thin film. The cadmium vacancies form double acceptors. The method also includes exposing the CdTe thin film to one or more vacancy substituting agents after growth of the CdTe thin film solar cell to defect complexes for the Cd vacancies in the CdTe thin film. The present disclosure also provides for a substitional defect, such as a noble metal, to be substituted for the cadmium vacancies.

In yet another aspect, a cadmium Sulfide/cadmium telluride (CdS/CdTe) solar cell is disclosed. The CdS/CdTe solar cell includes a CdTe thin film and one or more than one p-dopant. The p-dopants are incorporated in the CdTe and can include a single acceptor substitutional defect and/or a defect complex as a single acceptor having a double acceptor compensated by a single donor.

Other objects and features will become apparent from the following detailed description considered in conjunction with the accompanying drawings. It is to be understood, however, that the drawings are designed as an illustration only and not as a definition of the limits of the invention.

BRIEF DESCRIPTION OF THE DRAWINGS

So that those having ordinary skill in the art will have a better understanding of how to make and use the disclosed systems and methods, reference is made to the accompanying figures wherein.

DETAILED DESCRIPTION OF EXEMPLARY EMBODIMENTS

Figure 1:
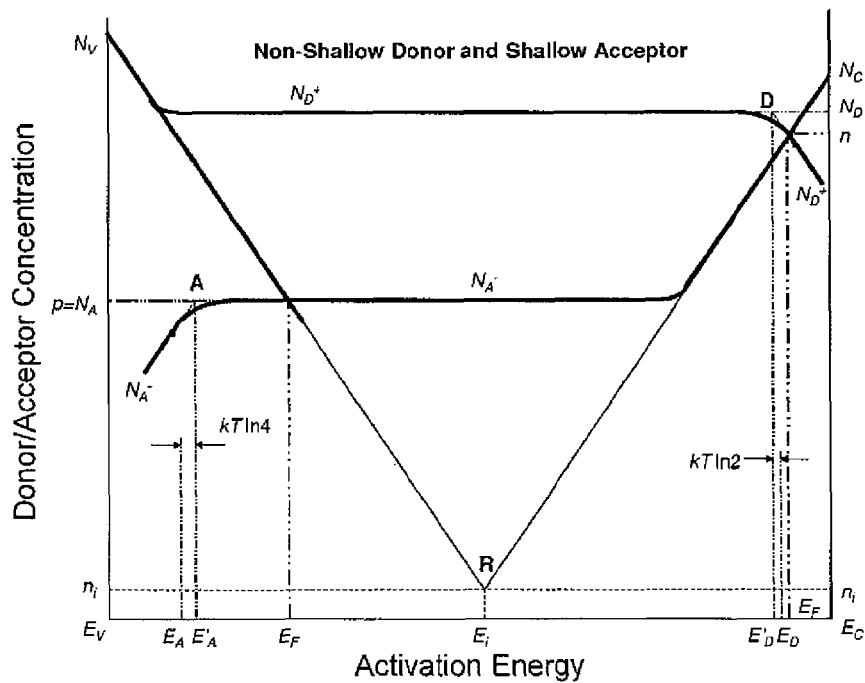
FIG. 1 is graph showing a fully activated acceptor state A and partially activated donor state D.
Figure 2:
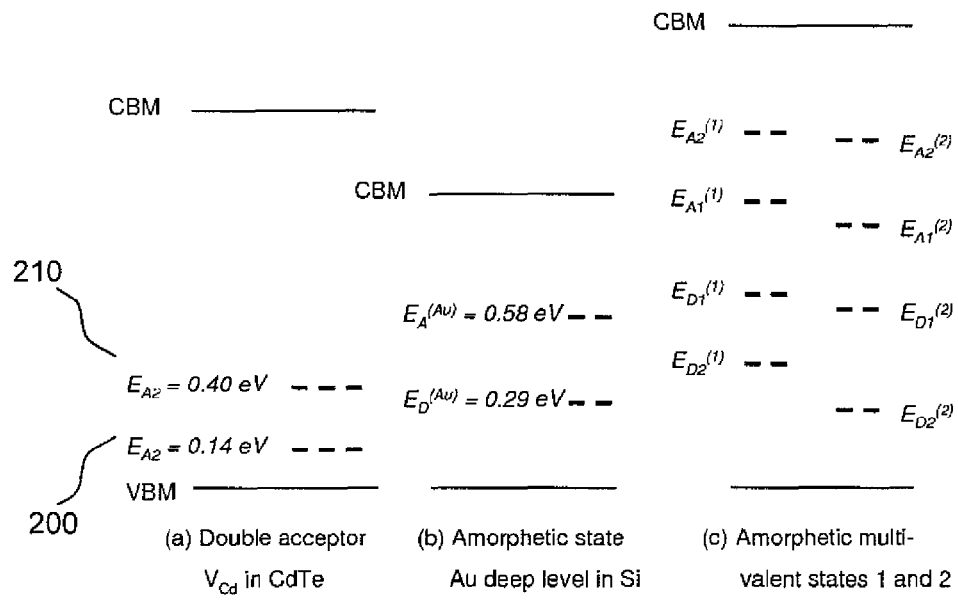
FIGS. 2A-C show examples of intrinsic/impurity defects that have multi-level impurity/defect states.

The following detailed description of exemplary embodiments is provided to aid those skilled in the art in practicing exemplary embodiments of the present disclosure. Modifications and variations in the embodiments described herein can be implemented without departing from the spirit or scope of the described embodiments. Unless otherwise defined, all technical and scientific terms used herein have the same meaning as commonly understood by one of ordinary skill in the art to which the embodiments belong. The terminology used herein is for describing particular embodiments only and is not intended to be limiting.

Exemplary embodiments of the present disclosure are directed to improving p-type doping (p-doping) of cadmium telluride (CdTe) for CdTe-based solar cells, such as cadmium Sulfide (CdS)/CdTe solar cells. CdTe can be fabricated as a polycrystalline thin film photovoltaic semiconductor. Embodiments can achieve improved p-doping of CdTe by creating a high density of cadmium (Cd) vacancies ($V_{Cd}$) and subsequently substituting the $V_{Cd}$ with a high density of noble metal substitutes of Cd and/or a high density of defect complexes. The concentration of the noble metal defects and/or the defect complex in the CdTe can be dependent on the density of Cd vacancies created. Formation of a high density of noble metal defects and/or defect complexes as a p-dopant can improve light-to-electricity conversion efficiency, doping levels or hole concentrations, junction band bending, and/or ohmic contact associated with p-type CdTe (p-CdTe) based solar cells.

The defect complex or A-Center of a single acceptor state formed by a single donor halogen substitute of tellurium attached to a double acceptor cadmium vacancy ($V_{Cd}$) can be a suitable p-dopant for CdTe polycrystalline thin film used in CdTe solar cells. Improvement of CdTe solar cell performance, for example by cadmium chloride ($CdCl_2$) treatment can be attributed to a replacement of double acceptor $V_{Cd}$ by single acceptor $V_{Cd}^{2-}$-$Cl_{Te}^{+}$ and/or a noble metal substitution of cadmium. Other halogens, such as F, Br, and I, can also form A-centers in CdTe with similar properties as that formed by Cl.

Cd vacancies can operate as an enabler, according to a cadmium vacancy theory of the present disclosure, for formation of desired p-dopants Cu substitute of Cd ($Cu_{Cd}$) and defect complex A-center $V_{Cd}^{2-}$-$Cl_{Te}^{+}$ in thin film CdTe photovoltaics (PV). Without Cd vacancies, the relatively low processing temperature of CdTe solar cells prohibits the formation of $Cu_{Cd}$ and A-centers. The involvement of Cd vacancies in the formation of $Cu_{Cd}$ and A-center leads to the lowering of reaction barrier, and makes the formation of $Cu_{Cd}$ and A-center energetically more favorable.

include one or more halogens from Group VIIA (group 17) of the periodic table. For example, the reactive oxidizer can include oxygen ($O_2$), ozone ($O_3$), fluorine ($F_2$), chlorine ($Cl_2$), iodine ($I_2$), and/or bromine ($Br_2$). The reactive oxidizers can interact with the CdTe to produce a high density of Cd vacancies ($V_{Cd}$) in the CdTe thin film. Since a formation energy for oxidized cadmium can be smaller than that of oxidized tellurium, oxidizing the CdTe with one or more of the reactive oxidizers can create Cd vacancies on a surface and in the bulk of the CdTe thin film. This can facilitate a creation of a high concentration of Cd vacancies in the CdTe thin film. For example, a Cd vacancy concentration of equal to or greater than about $1.0 \times 10^{16}$ cm$^{-3}$ can be achieved. The Cd vacancies can be double acceptors being assigned a first ionization energy of about 0.14 eV and second ionization energy of about 0.40 eV based low temperature photoluminescence (LTPL), optical magnetic resonance (OMR), electron paramagnetic resonance (EPR) data, and Hall data.

Figures 3, 4:
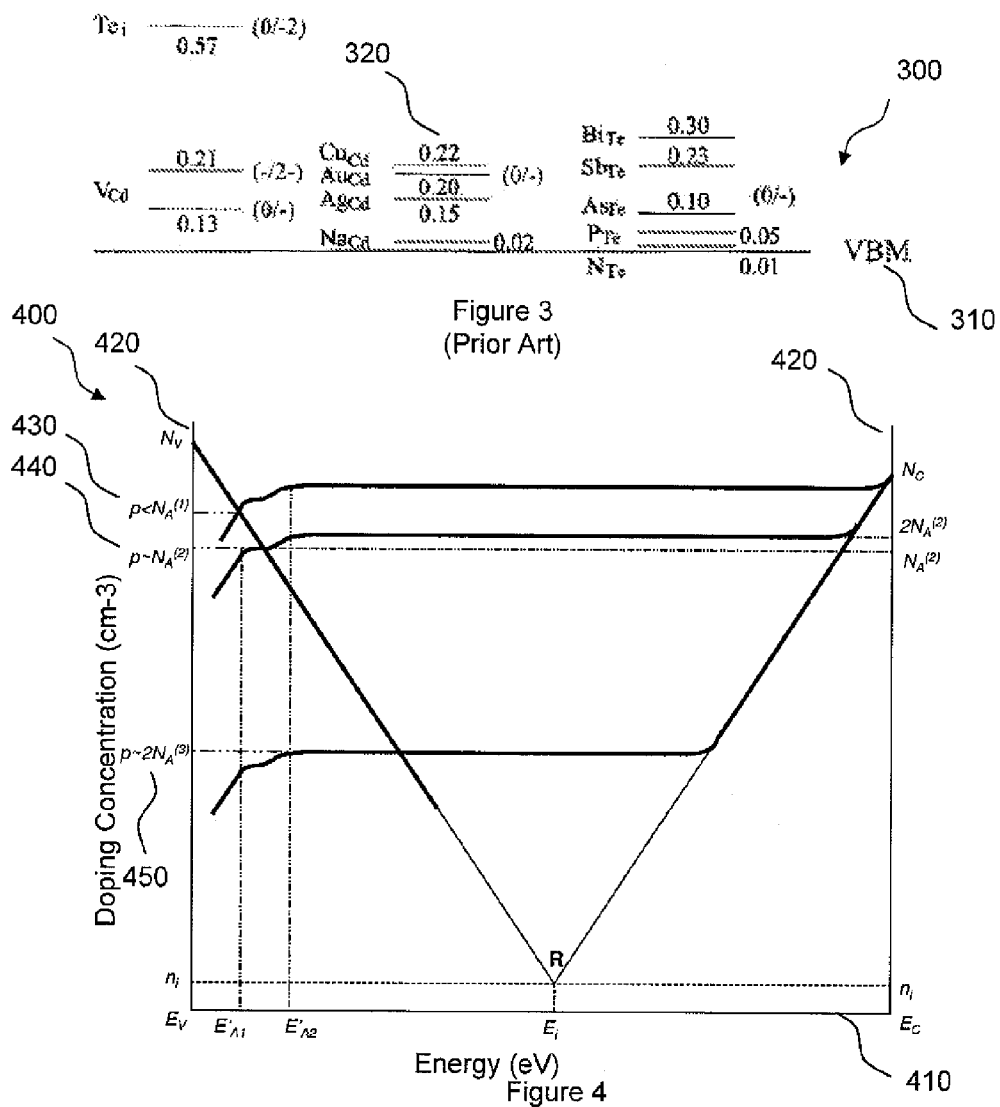
FIG. 3 shows exemplary acceptor states of intrinsic/impurity defects in CdTe and their associated activation energies.
FIG. 4 shows three concentrations of Cd vacancy acceptors that can be doubly ionized in CdTe.

FIG. 4 is a plot 400 of the LCN equation (7) of CdTe with the double acceptor Cd vacancy as its only dopant. The x-axis 410 can represent the activation energy and the y-axis 420 can represent the doping concentration. For three different concentrations of the Cd vacancies, $N_A^{(1)} > N_A^{(2)} > N_A^{(3)}$, the plot 400 shows that eq. (1) is invalid, since the doping level p divided by the first acceptor concentration $N_A^{(1)}$ is much less than one ($p/N_A^{(1)} \ll 1$) (430), the doping level p divided by the second acceptor concentration $N_A^{(2)}$ is approximately one ($p/N_A^{(2)} \sim 1$) (440), and the doping level p divided by the third acceptor concentration $N_A^{(3)}$ is approximately two ($p/N_A^{(3)} \sim 2$) (450). The level or percentage of the dopant activation depends not only on the activation energy, but also on the concentration. The contribution of being "double" acceptors to the level of hole density is a factor of two or less ($\leq 2$), insignificant for doping, which is evaluated in logarithmic scale. The second ionization energy level, however, is deeper than $E_F$ for both $N_A^{(1)}$ and $N_A^{(2)}$, and therefore, may result in undesired SRH recombination centers or deep level traps. For the Cd vacancy concentration of $N_A^{(3)}$, which is lower than the doping level of any device, the level of second ionization, as that of the first ionization, plays virtually no role. Based on the above, Cd vacancies as p-dopant are less suitable than embodiments of the defect complexes in the present disclosure. For example, as shown in Table 1, and discussed in more detail below, a defect complex, $V_{Cd}^{2-}$-$Cl_{Te}^{+}$, can be formed in CdTe thin films that has the same first transition energy level as the Cd vacancies, but without a second ionization and the detrimental effect associated therewith.

TABLE 1

Three probable p-dopants of CdTe polycrystalline thin film.
The experimentally measured data using Hall effects and DLTS [3]
should be E'$_A$ instead of ionization energy E$_A$

|  | $E_A$ (eV) Theoretical | $E_A$ (eV) PL | $E_A$ (eV) Hall | $E_A$ (eV) DLTS | $E_A$ (eV) LTPL + OMR, EPR | $E_A$ (eV) Assigned |
|---|---|---|---|---|---|---|
| $V_{Cd}\|^{0/-}$ | 0.13 |  | 0.15 |  |  | 0.14 |
| $V_{Cd}\|^{-/2-}$ | 0.21 |  | 0.6-0.9 |  | <0.47 | 0.40 |
| $Cu_{Cd}\|^{0/-}$ | 0.22 | 0.15 | 0.3-0.4 | 0.35 |  | 0.15~0.25 |
| $V_{Cd}^{2-}$ - $Cl_{Te}^{+}\|^{0/-}$ |  | 0.12 | 0.14-0.17 | 0.12 | 0.12 | 0.12~0.14 |

In exemplary embodiments, the Cd vacancies can be created in a CdTe thin film during growth of the CdTe thin film. For example, during the growth of the CdTe thin film, exemplary embodiments of the present disclosure can treat the CdTe thin film with one or more reactive oxidizers that After the CdTe thin film has been exposed to one or more reactive oxidizers to produce the Cd vacancies, the CdTe thin film can be treated with a vacancy substituting agent, which can be a chemical compound that includes cadmium (Cd) and a halogen from Group VIIA (group 17) of the periodic table.

For example, the vacancy substituting agent can be cadmium Fluoride ($CdF_2$), cadmium Chloride ($CdCl_2$), cadmium Bromide ($CdBr_2$), and/or cadmium Iodide ($CdI_2$). The CdTe film can be exposed to the vacancy substituting agent post growth and the vacancy substituting agent can interact with the Cd vacancies of the CdTe thin film to substitute defect complexes for the Cd vacancies.

To obtain a desired concentration of a defect complex, for example on the order of approximately $1.0 \times 10^{16}$ cm$^{-3}$, a Cd vacancy ($V_{Cd}$) density is created having a concentration that is equal to or higher than a desired concentration of the defect complex. Since the defect complexes are formed using the Cd vacancies, a higher concentration of Cd vacancies can lead to a higher concentration of the defect complex in the CdTe thin film.

The defect complexes can be a single acceptor due to compensation of the double acceptor Cd vacancies by an adjacent single donor formed by a halogen substitution of tellurium facilitated by the vacancy substituting agent. The halogen substitution of tellurium in the defect complex can modify the first activation energy level of a Cd vacancy and can eliminate the second ionization of the Cd vacancy. This can transform the undesired p-dopant $V_{Cd}$ into a desired p-dopant formed by the defect complex. The defect complex formed when $CdF_2$ is used as the vacancy substituting agent can be $V_{Cd}^{2-}\text{-}F_{Te}^{+}$, where represents a cadmium vacancy as a double acceptor and $F_{Te}^{+}$ represents a fluorine substitution of tellurium as a single donor. The defect complex formed for embodiments in which $CdCl_2$ is used as the vacancy substituting agent can be $V_{Cd}^{2-}\text{-}Cl_{Te}^{+}$, where $V_{Cd}^{2-}$ represents a cadmium vacancy as a double acceptor and $Cl_{Te}^{+}$ represents a chlorine substitution of tellurium as a single donor. The defect complex formed for embodiments in which $CdBr_2$ is used as the vacancy substituting can be be $V_{Cd}^{2-}\text{-}Br_{Te}^{+}$, where $V_{Cd}^{2-}$ represents a cadmium vacancy as a double acceptor and $Br_{Te}^{+}$, represents a bromine substitution of tellurium as a single donor. The defect complex formed for embodiments in which $CdI_2$ is used as the vacancy substituting agent can be be $V_{Cd}^{2-}\text{-}I_{Te}^{+}$, where $V_{Cd}^{2-}$ represents a cadmium vacancy as a double acceptor and $I_{Te}^{+}$ represents a iodine substitution of tellurium as a single donor. The defect complex can have an ionization energy that is comparable to the first ionization energy of a Cd vacancy. For example, the defect complex be $V_{Cd}^{2-}\text{-}Cl_{Te}^{+}$, which represents one embodiment of a defect complex in the present disclosure, can have an activation energy of 0.12 eV. Since the first ionization energy of the Cd vacancies in CdTe is close to the ionization energy of the defect complex, $V_{Cd}^{2-}\text{-}Cl_{Te}^{+}$, the Cd vacancy and $V_{Cd}^{2-}\text{-}Cl_{Te}^{+}$ can be viewed as different configurations of the same defect.

A critical doping level $p_c$ for a semiconductor can be determined to identify a desired dopant level for the semiconductor. When an activation energy $E'_A$ of a dopant is substantially equal to Fermi level $E_F$, a critical doping level $p_c$ of a dopant can be defined as follows:

$$p_c = N_V \exp\left(\frac{E_V - E'_A}{kT}\right) = N_A^- = \frac{1}{2} N_A, \quad (9)$$

where $N_v$ is the effective density or concentration of states in the valence band, $E_v$ is the valance band maximum (VBM), k is the Boltzmann constant, T is the absolute temperature in Kelvin, $N_A^-$ is the density or concentration of the ionized acceptor, and $N_A$ is the density or concentration of the acceptor. When the desired hole density p is less than critical doping level $p_c$ ($p<p_c$), the hole density is approximately equal to concentration of acceptors $N_A$ ($p \sim N_A$), and when desired hole density p is greater than the critical doping level $p_c$ ($p>p_c$), the hole density p is much less than the concentration of acceptors $N_A$ ($p<<N_A$). A high dopant concentration implies high solubility, which in practice may not be easy to obtain. As an example, for $V_{Cd}$ and $V_{Cd}^{2-}\text{-}Cl_{Te}^{+}$, the critical doping level $p_c$ can be about $8.1 \times 10^{16}$ to about $1.8 \times 10^{17}$ cm$^{-3}$, respectively. Therefore, a dopant with small activation energy is usually pursued.

The defect complex $V_{Cd}^{2-}\text{-}Cl_{Te}^{+}$, which is one exemplary vacancy-substitute defect complex, is a double acceptor compensated by a single donor forming a single acceptor. The defect complex $V_{Cd}^{2-}\text{-}Cl_{Te}^{+}$, has an activation energy of 0.12 eV and critical p-doping $p_c$ of about $1.8 \times 10^{17}$ cm$^{-3}$. Based on the aforementioned, the defect complex $V_{Cd}^{2-}\text{-}Cl_{Te}^{+}$ represents a suitable p-dopant for CdTe used in CdS/CdTe thin film solar cells and solar modules, and can provide improved performance over a Cu substitute of Cd ($Cu_{Cd}$) as a p-dopant, which has an activation energy 0.35 eV and $p_c=2.4 \times 10^{13}$ cm$^{-3}$. Furthermore, the defect complex $V_{Cd}^{2-}\text{-}Cl_{Te}^{+}$ unlike Cd vacancies, does not include a detrimental second ionization energy deep level as SRH recombination-center.

In exemplary embodiments, a noble metal can be substituted for the Cd vacancies as a p-dopant during and/or after thin film growth. For example, copper (Cu) can be substituted for the Cd vacancies (Cu substitute of Cd, $Cu_{Cd}$) as a result of diffusion of copper, either naturally existing or introduced during the processing of a CdS/CdTe solar cell. As a result, a CdTe thin film, in exemplary embodiments, can include defect complexes and/or substitutional defects (e.g., a noble metal substitute) as p-dopants, such that a high density p-doping concentration (e.g., approximately equal to or greater than $1.0 \times 10^{16}$ cm$^{-3}$) can be achieved based a noble metal substitution of cadmium, a defect complex, and/or a combination of a noble metal substitution of cadmium and a defect complex.

In some embodiments, a temperature at which the CdTe thin film is processed can affect the properties and quality of the CdTe thin film. For example, the CdTe thin film can be processed at a specified temperature during growth of the CdTe thin film to aid in the creation of Cd vancancies $V_{Cd}$ and in the formation defect complexes. In some embodiments, the treatment temperature during CdTe growth can be about 280° C. As another example, in some embodiments, a treatment temperature during growth of between approximately 260° C. and approximately 310° C. can be used. Treatment in approximately this temperature range can provide an optimized CdTe thin film, as indicated by a long minority carrier lifetime and a high efficiency of a CdTe based solar cell for which the CdTe thin film was processed at about 280° C. If the temperature is increased substantially higher than about 280° C., the CdTe thin film can transition from p-type to insulating, or even to n-type. Such a complicated and puzzling effect of temperature on the property and quality of the CdTe thin film—turning from a poor p-type to a poorer p-type, to a better and optimized p-type, to insulating, and to n-type—is attributed to different levels of Cu involvement in the CdTe thin film.

Figure 5:
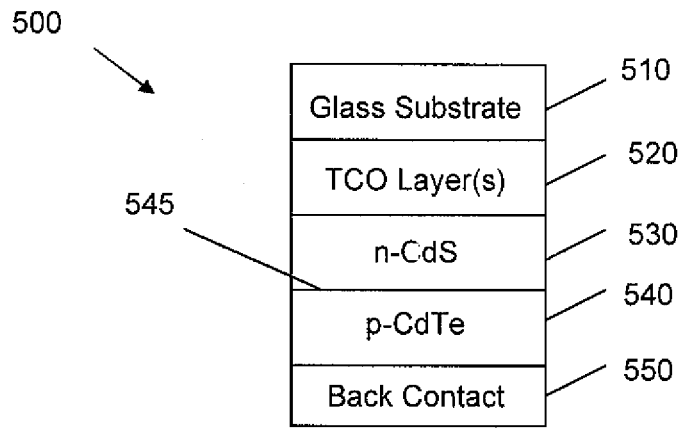
FIG. 5 shows a cross-section of an exemplary cadmium sulfide (CdS)/cadmium telluride (CdTe) solar cell in which the cadmium telluride is doped in accordance with exemplary embodiments of the present disclosure.

FIG. 5 is a cross-section of an exemplary CdS/CdTe solar cell 500 (hereinafter "solar cell 500") that can be formed in accordance with exemplary embodiments of the present disclosure. The solar cell 500 can includes a glass substrate 510, one or more transparent conductive oxide (TCO) layers 520, an n-type cadmium sulfide (CdS) layer 530, a p-type cadmium telluride (CdTe) thin film layer 540 (hereinafter "CdTe layer 540"), and a back contact 550. The glass substrate 510 is a transparent layer that allows photons to enter the solar cell

500. The one or more TCO layers 520 can function as anti-reflective layers that channels the photons to the CdS layer 530. Furthermore, the TCO layer(s) can operate as a first conductor of the solar cell 500. The CdS layer absorbs the photon, which creates an electron hole in the valance band of the CdS layer 530. The CdS layer 530 and the CdTe layer 540 form a pn-junction 545 such that electrons of the CdTe layer 540 flow through the pn-junction 545 to fill the hole created by the photon on the valance band of the CdS layer 530. The back contact 550 forms a second conductor of the solar cell 500

In some embodiments, CdTe layer 540 can have a p-doping level of greater than or equal to approximately $1.0 \times 10^{16}$ cm$^{-3}$ to improve light-to-electricity conversion efficiency, doping levels or hole concentrations, junction band bending, and/or ohmic contact associated with over conventional p-CdTe-based solar cells, as well as to achieve a minority carrier (electron) life time longer than 1 ns for less dark current. The CdTe layer 540 can be doped using noble metal substitutes of cadmium and/or defect complexes as described herein. For example, the CdTe layer 540 can be doped with a defect complex having a double acceptor compensated by a single donor forming a single acceptor and/or can be doped using a copper substitute of cadmium ($Cu_{Cd}$). The defect complex can be formed as $V_{Cd}$-$F_{Te}$, $V_{Cd}$-$V_{Cd}$-$Br_{Te}$, and/or $V_{Cd}$-$I_{Te}$.

Figure 6:
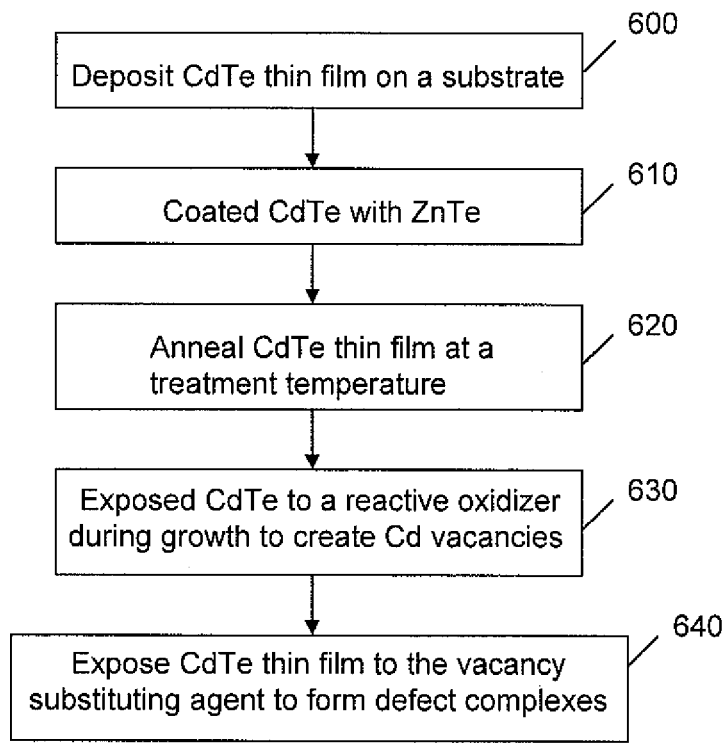
FIG. 6 shows an exemplary doping process for a cadmium telluride (CdTe) thin film for a cadmium-based solar cell.

FIG. 6 is a flowchart illustrating an exemplary process for developing a p-type CdTe polycrystalline thin film semiconductor for a CdS/p-CdTe solar cell using a defect complex as a p-dopant. To begin a CdTe polycrystalline thin film can be deposited on a substrate (600). For example, the CdTe thin film can deposited on the substrate using close space sublimation (CSS) and/or other thin film deposition techniques. The deposited CdTe thin film can be coated with ZnTe:Cu (approximately nine atomic percentage of Cu) (610). The ZnTe:Cu can be sputtered, thermally evaporated, pasted, and the like, to coat the CdTe thin film. The coated CdTe thin film can be annealed to a treatment temperature for back contact (620). For example, the treatment temperature can be set within a range of about 260° C. to about 310° C. or about 280° C. to about 300° C. to optimize CdTe thin film growth.

To obtain high desired concentration of a defect complex, for example on the order of approximately $1.0 \times 10^{16}$ cm$^{-3}$, Cd vacancies are created having a concentration that is equal to or greater than the desired concentration of the defect complex. Since the defect complexes are formed using the Cd vacancies, a higher concentration of Cd vacancies can lead to a higher concentration of the defect complex in the CdTe thin film. To create the Cd vacancies, the CdTe thin film can be exposed to a reactive oxidizer during growth of the CdTe thin film to oxidize the CdTe (630). Since the formation energy for oxidized cadmium is smaller than that of tellurium, introducing reactive oxidizer during growth of the CdTe thin film can create high concentrations Cd vacancies on the surface and in bulk. For example, a concentration of equal to or greater than about $1.0 \times 10^{16}$ cm$^{-3}$ can be created. The reactive oxidizer can include oxygen ($O_2$), ozone ($O_3$), fluorine ($F_2$), chlorine ($Cl_2$), iodine ($I_2$), and/or bromine ($Br_2$). The oxidation process can be performed during the CdTe thin film growth and can be carried out with a reactive oxidizer pressure of about 1 Torr, where the reactive oxidizer is mixed with a carrying gas, such as Helium (He) having a pressure of about 10 Torr, under a base pressure of less than about 100 mTorr.

After the CdTe has been exposed to the reactive oxidizer during the oxidation process, the CdTe thin film can be exposed to the vacancy substituting agent to form defect complexes using the Cd vacancies that were created (640). The CdTe thin film can be exposed to the vacancy substituting agent after the CdTe has been grown. Exposure to the vacancy substituting agent results in a substitution of single acceptor defect complexes (i.e., a double acceptor compensated by a single donor) for the double acceptor Cd vacancies.

In some embodiments, the vacancy substitution agent can be in a gaseous form, such that the CdTe thin film can be treated by the gaseous vacancy substituting agent. The vacancy substituting agent can be delivered to the CdTe thin film at a pressure of about 1 Torr with the a carrying gas, such as He, having a pressure of about 1 Torr and base pressure under about 100 mTorr. The CdTe thin film can be exposed to the vacancy substituting agent at a temperature 400° C. post growth for approximately 30 minutes to form donor states of the defect complex and the desired defect complexes.

In some embodiments, the vacancy substitution agent can also be delivered in a solution, such that the CdTe thin film can be dipped in or otherwise exposed to the solution. For example, the vacancy substituting agent can be included in methanol solution, where the vacancy substitution agent is approximately 75% saturated. The CdTe thin film can be exposed to the solution for approximately 20 minutes followed by exposure to a temperature of about 400° C. for approximately 30 minutes under base pressure less than about 10 mTorr to form donor states associated with the defect complex and to form the defect complexes.

Some examples of defect complex formation using specific reactive oxidizers and vacancy substituting agents are included below. The examples are not intended to be limiting, but rather to illustrate exemplary embodiments of the present disclosure. Those skilled in the art will recognize that other reactive oxidizers and/or vacancy substituting agents can be used to create the Cd vacancies and/or the defect complexes in accordance with the present disclosure.

In some embodiments, the reactive oxidizer oxygen $O_2$ and/or ozone $O_3$ can be used during the oxidation process to oxidize the CdTe and create a high desired concentration of Cd vacancies. Because the formation energy of cadmium oxide is smaller than that of tellurium oxide, Cd vacancies are created on the surface and in the bulk of the CdTe thin film in growth. The oxygen $O_2$ and/or ozone $O_3$ can be delivered at a pressure of about 1 Torr, mixed with carrying gas He of about 10 Torr, under base pressure less than about 100 mTorr.

In some embodiments, the reactive oxidizer chlorine $Cl_2$ can be used during the oxidation process to chloridize the CdTe and create a high desired concentration of Cd vacancies. Because the formation energy of cadmium chloride is smaller than that of tellurium chloride, Cd vacancies are created on the surface and in the bulk of the CdTe thin film in growth. The chlorine $Cl_2$ can be delivered at a pressure of about 1 Torr, mixed with carrying gas He of about 10 Torr, under base pressure less than about 100 mTorr.

For embodiments in which the reactive oxidizer used to create the Cd vacancies is either $O_2$, $O_3$, or $Cl_2$, cadmium Chloride ($CdCl_2$) can be used as the vacancy substitution agent. The $CdCl_2$ can be delivered as a gas at a pressure of about 1 Torr with the same carrying gas and base pressure at a temperature of about 400° C. for approximately 30 minutes to form donor states $Cl_{Te}$ and the desired $V_{Cd}$-$Cl_{Te}$ defect complexes. Alternatively, the $CdCl_2$ can be delivered as in a methanol solution with approximately 75% saturated $CdCl_2$ for approximately 20 minutes followed by exposure to a temperature of about 400° C. for approximately 30 minutes under base pressure less than about 10 mTorr to form donor states $Cl_{Te}$ and the desired $V_{Cd}$-$Cl_{Te}$ defect complexes.

In some embodiments, the reactive oxidizer fluorine $F_2$ can be used during the oxidation process to fluoridize the CdTe and create a high desired concentration of Cd vacancies.

Because the formation energy of cadmium fluoride is smaller than that of tellurium fluoride, Cd vacancies are created on the surface and in the bulk of the CdTe thin film in growth. The fluorine $F_2$ can be delivered at a pressure of about 1 Torr, mixed with carrying gas He of about 10 Torr, under base pressure less than about 100 mTorr.

For embodiments in which the reactive oxidizer used to create the Cd vacancies is $Fl_2$, cadmium fluoride ($CdF_2$) can be used as the vacancy substitution agent. The $CdF_2$ can be delivered as a gas at a pressure of about 1 Torr with the same carrying gas and base pressure at a temperature of about 400° C. for approximately 30 minutes to form donor states $F_{Te}$ and the desired $V_{Cd}$-$F_{Te}$, defect complexes. Alternatively, the $CdF_2$ can be delivered as in a methanol solution with approximately 75% saturated $CdF_2$ for approximately 20 minutes followed by exposure to a temperature of about 400° C. for approximately 30 minutes under base pressure less than about 10 mTorr to form donor states $F_{Te}$ and the desired $V_{Cd}$-$F_{Te}$ defect complexes.

Although the systems and methods of the present disclosure have been described with reference to exemplary embodiments thereof, the present disclosure is not limited thereby. Indeed, the exemplary embodiments are implementations of the disclosed systems and methods are provided for illustrative and non-limitative purposes. Changes, modifications, enhancements and/or refinements to the disclosed systems and methods may be made without departing from the spirit or scope of the present disclosure. Accordingly, such changes, modifications, enhancements and/or refinements are encompassed within the scope of the present invention.

What is claimed is:

1. A method of doping a polycrystalline thin film photovoltaic material for a solar cell comprising:
   introducing a reactive oxidizer to the polycrystalline thin film photovoltaic material during thin film growth to create vacancies in the polycrystalline thin film photovoltaic material; and
   exposing the polycrystalline thin film photovoltaic material to a vacancy substitution agent after thin film growth to substitute defect complexes for the vacancies in the polycrystalline thin film photovoltaic material, the vacancy substituting agent being a chemical compound including an element present in the polycrystalline thin film photovoltaic material and a halogen;
   wherein the defect complexes are single acceptors formed from double acceptors compensated by single donors, the double acceptors being cadmium vacancies and the single donors being a halogen substitution of tellurium.

2. The method of claim 1, wherein the polycrystalline thin film photovoltaic material is cadmium telluride (CdTe).

3. The method of claim 2, wherein the vacancy substituting agent is at least one of cadmium Chloride ($CdCl_2$), cadmium Fluoride ($CdF_2$), cadmium bromide ($CdBr_2$), and cadmium iodide ($CdI_2$).

4. The method of claim 1, wherein the reactive oxidizer and the vacancy substituting agent include a common element of at least one of fluorine ($F_2$), and chlorine ($Cl_2$).

5. The method of claim 1, wherein the reactive oxidizer is a gas and introducing a reactive oxidizer comprises:
   mixing the reactive oxidizer with a carrying gas for delivery to polycrystalline thin film photovoltaic material, the reactive oxidizer being at about one Torr of pressure, the carrier gas being at about ten Torr of pressure, and a base pressure being less than about one hundred milliTorr (mTorr).

6. The method of claim 1, wherein the vacancy substituting agent is in a gaseous state and treating the polycrystalline thin film photovoltaic material with the vacancy substituting agent comprises exposing the polycrystalline thin film photovoltaic material to the vacancy substituting agent at a specified temperature for specified period of time.

7. The method of claim 1, wherein the vacancy substituting agent is included in a methanol solution and treating the polycrystalline thin film photovoltaic material with the vacancy substituting agent comprises:
   dipping the polycrystalline thin film photovoltaic material into the methanol solution for a first period of time;
   removing the polycrystalline thin film material from the methanol solution; and
   exposing the thin film material to a specified temperature for a second period of time.

8. The method of claim 1, wherein the defect complexes include at least one of $V_{Cd}$-$F_{Te}$, $V_{Cd}$-$Cl_{Te}$, $V_{Cd}$-$Br_{Te}$, and $V_{Cd}$-$I_{Te}$.

9. The method of claim 1, wherein a noble metal is substituted for at least one of the vacancies.

10. A method of doping a cadmium telluride (CdTe) thin film for a cadmium Sulfide/cadmium telluride (CdS/CdTe) solar cell comprising:
    introducing the CdTe thin film to a reactive oxidizer during growth of the CdTe thin film to create cadmium vacancies in the CdTe thin film, the cadmium vacancies forming double acceptors; and
    exposing the CdTe thin film to a vacancy substituting agent after growth of the CdTe thin film solar cell to substitute defect complexes for the cadmium vacancies in the CdTe thin film.

11. The method of claim 10, wherein the reactive oxidizer includes at least one oxygen ($O_2$), ozone ($O_3$), fluorine ($F_2$), chlorine ($Cl_2$), bromine ($Br_2$), and iodine ($I_2$).

12. The method of claim 11, wherein introducing the CdTe thin film to a reactive oxidizer comprises:
    mixing the reactive oxidizer with a carrying gas for delivery to the CdTe thin film material; the reactive oxidizer being a gas at about one Torr of pressure, the carrier gas being at about ten Torr of pressure, and a base pressure being less than about one hundred milliTorr (mTorr).

13. The method of claim 11, wherein the vacancy substituting agent includes at least one of cadmium chloride ($CdCl_2$), cadmium fluoride ($CdF_2$), cadmium bromide ($CdBr_2$), and cadmium iodide ($CdI_2$).

14. The method of claim 13, wherein the CdTe thin film is exposed to $CdCl_2$ in response to using at least one of oxygen ($O_2$), ozone ($O_3$), and chlorine ($Cl_2$) for the reactive oxidizer.

15. The method of claim 13, wherein the CdTe thin film is exposed to $CdF_2$ in response to using fluorine ($F_2$) as the reactive oxidizer.

* * * * *